United States Patent
Gwoziecki et al.

(10) Patent No.: US 8,604,482 B2
(45) Date of Patent: Dec. 10, 2013

(54) MICROELECTRONIC DEVICE WITH DISCONNECTED SEMICONDUCTOR PORTIONS AND METHODS OF MAKING SUCH A DEVICE

(75) Inventors: Romain Gwoziecki, Foulain (FR); Romain Coppard, Voiron (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/695,903

(22) PCT Filed: May 3, 2011

(86) PCT No.: PCT/EP2011/057065
§ 371 (c)(1),
(2), (4) Date: Nov. 2, 2012

(87) PCT Pub. No.: WO2011/138332
PCT Pub. Date: Nov. 10, 2011

(65) Prior Publication Data
US 2013/0056834 A1 Mar. 7, 2013

(30) Foreign Application Priority Data
May 5, 2010 (FR) ...................................... 10 53508

(51) Int. Cl.
*H01L 29/04* (2006.01)
*H01L 31/036* (2006.01)
*H01L 31/0376* (2006.01)
*H01L 31/20* (2006.01)

(52) U.S. Cl.
USPC 257/59; 257/72; 257/E29.117; 257/E21.053; 438/48

(58) Field of Classification Search
USPC ...................... 257/59, 72, E29.117, E29.273, 257/E21.617, E21.053; 438/48, 128, 149
See application file for complete search history.

(56) References Cited

U.S. PATENT DOCUMENTS

| | | |
|---|---|---|
| 2007/0120167 A1 | 5/2007 | Duan et al. |
| 2007/0132023 A1 | 6/2007 | Ahn et al. |
| 2010/0025666 A1 | 2/2010 | Hakii |
| 2010/0059766 A1* | 3/2010 | Fornara et al. .................. 257/79 |

FOREIGN PATENT DOCUMENTS

| | | |
|---|---|---|
| EP | 1 727 219 A1 | 11/2006 |
| EP | 2 113 944 A1 | 11/2009 |

OTHER PUBLICATIONS

French Preliminary Search Report issued Dec. 1, 2010, in French Patent Application No. 1053508 with English translation of category of cited documents.
International Search Report issued Jul. 6, 2011, in PCT/EP2011/057065 with English translation.
Jean-Marie Verilhac, et al., "Step toward robust and reliable amorphous polymer field-effect transistors and logic functions made by the use of roll to roll compatible printing processes", Organic Electronics, vol. 11, No. 3, XP-026888758, Mar. 1, 2010, pp. 456-462.

* cited by examiner

*Primary Examiner* — Hoai V Pham
(74) *Attorney, Agent, or Firm* — Oblon, Spivak, McClelland, Maier & Neustadt, L.L.P.

(57) ABSTRACT

A microelectronic device includes a plurality of disconnected similar semiconducting portions, electrically isolated from each other and forming a semiconductor layer, at a spacing by a constant distance and with a shape parallel to the other portions. The microelectronic device also includes two electrodes arranged in contact with the semiconductor layer such that a maximum distance separating the two electrodes is less than the largest dimension of one of the semiconductor portions. The shape and dimensions of the semiconductor portions, the spacing between the semiconductor portions, the shape and dimensions of the electrodes and the layout of the electrodes relative to the semiconductor portions are such that at least one of the semiconductor portions electrically connects the two electrodes to each other. The largest dimensions of the semiconductor portions are perpendicular to the largest dimension of the electrodes, the electrodes being similar.

10 Claims, 3 Drawing Sheets

MICROELECTRONIC DEVICE WITH DISCONNECTED SEMICONDUCTOR PORTIONS AND METHODS OF MAKING SUCH A DEVICE

TECHNICAL FIELD

The invention relates to a microelectronic device comprising disconnected semiconductor portions and more particularly a microelectronic device comprising one or several transistors formed from such disconnected semiconductor portions as active zones.

The invention is particularly adapted to the field of thin film transistors (TFT) and particularly organic thin film transistors (OFET or OTFT).

STATE OF PRIOR ART

Manufacturing of a thin film device such as a thin film transistor comprising a thin semiconductor layer for example based on organic material, implies a shaping of this semiconductor layer so that electrodes can then be made that form the electrical source and drain contacts, but also so that the transistor obtained has a small current $I_{off}$ (corresponding to the current $I_{DS}$ for $V_{GS}=0$ and $V_{DS}=V_{alim}$) and the lowest possible parasite capacitances.

The equipment used to deposit the semiconductor layer must have an alignment system in order that the semiconductor layer can be shaped. This type of alignment equipment is derived from conventional printing equipment, for example such as roll-to-roll processing machines, which usually have poor alignment precision performances.

Due to this poor alignment precision, these thin film transistors are sized with margins (on the dimensions) larger than minimum equipment alignment tolerances, which very much limits the integration density that can be obtained for these transistors.

PRESENTATION OF THE INVENTION

One purpose of this invention is to propose a new semiconductor device and a new method of making the semiconducting device, the structure of which can eliminate alignment steps to be applied when making thin film semiconductor devices according to prior art.

To achieve this, the invention proposes a microelectronic device comprising:
  a plurality of disconnected semiconducting portions with similar dimensions $L_{SC}$, $W_{SC}$ and similar shapes, electrically isolated from each other and forming a semiconductor layer, each of the semiconductor portions being at a spacing from adjacent semiconductor portions by an approximately constant distance $E_{SCH}$, $E_{SCV}$,
  at least two electrodes placed in contact with or adjacent to the semiconductor layer such that a maximum distance $L_{channel}$ separating the two electrodes is less than the largest dimension $L_{SC}$ of one of the semiconductor portions,
in which the shape and dimensions $L_{SC}$, $W_{SC}$ of the semiconductor portions, the spacing $E_{SCH}$, $E_{SCV}$ between the semiconductor portions, the shape and dimensions $L_{SD}$, $W_{SD}$ of the electrodes and the layout of the electrodes relative to the semiconductor portions are such that at least one of the semiconductor portions electrically connects the two electrodes to each other.

Therefore, the invention proposes to make the semiconductor layer of a microelectronic device in the form of a set of small semiconductor portions, for example distributed homogeneously, sized and spaced such that the statistical result obtained with at least two electrodes of the device in contact with these semiconductor portions with no particular alignment relative to these semiconductor portions, is that at least one semiconductor surface for example on which one or several active zones of the device will be formed is "self-aligned" relative to the electrodes, in other words is capable of setting up electrical conduction between the two electrodes. Thus, such a device may be made such that at least one of the semiconductor portions is capable of setting up electrical conduction between the two electrodes without any need for alignment of the electrodes relative to the semiconductor portions.

Furthermore, such a semiconductor layer can be used to make several semiconductor devices, for example transistors, adjacent to each other that will be automatically electrically isolated from each other, by choosing an appropriate minimum space between the electrodes of the devices, given that the semiconductor portions are initially electrically isolated from each other, only the electrodes of each device being electrically connected to each other by one or several semiconductor portions.

Advantageously, the semiconductor layer may be a thin layer, in other words a layer about 100 nm or less when the semiconductor is an organic material or about one 100 nm or a few tens of nanometers or less, for example about 50 nm, when the semiconductor is an inorganic material.

The device as defined in claim 1 has another advantage in that it has a small dispersion on the electrical characteristics of the device because the dispersion concerning the number of semiconductor portions electrically connecting the two electrodes is also small.

Each semiconductor portion has an elongated or oblong shape, of which the largest dimension $L_{SC}$ is approximately parallel to the largest dimensions $L_{SC}$ of the other semiconductor portions.

According to one advantageous embodiment, each of the semiconductor portions may have an approximately rectangular shape.

The semiconductor portions may be arranged in a plane parallel to a principal face of the semiconductor layer in contact with which the electrodes are arranged, following a regular pattern of parallel lines. A particular advantage of such of pattern is that it can be done easily due to the repetitiveness of the pattern that may be formed from several lines of semiconductor portions, this pattern being repeated one or several times.

In this case, spaces $E_{SCH}$ between the semiconductor portions on a single line may be offset relative to the spaces between the semiconductor portions of an adjacent line and along a direction parallel to the lines, by a distance D equal to about the largest dimension $L_{SC}$ of the semiconductor portions divided by n, where n is a real number greater than 1. Thus, the result obtained is a line to line offset of semiconductor portions forming a regular repetitive pattern of said lines.

In this case, the largest dimension $L_{SC}$ of the semiconductor portions may be approximately equal to n times the maximum distance $L_{channel}$ separating the two electrodes and/or the largest dimension $W_{SD}$ of the electrodes may be greater than about n times the smallest dimension $W_{SC}$ of the semiconductor portions.

The largest dimensions $L_{SC}$ of the semiconductor portions are approximately perpendicular to the largest dimension $W_{SD}$ of the electrodes, the electrodes possibly having similar shapes and dimensions $W_{SD}$, $L_{SD}$.

The device may comprise at least one transistor, of which an active zone may be formed by said at least one of the semiconductor portions electrically connecting the two electrodes to each other, said electrodes forming source and drain electrodes of the transistor.

The device may comprise a plurality of transistors, each transistor possibly comprising:
- at least two electrodes forming source and drain electrodes arranged in contact with the semiconductor layer such that the maximum distance $L_{channel}$ separating the two electrodes of one of the transistors is less than about the largest dimension $L_{SC}$ of one of the semiconductor portions,
- an active zone formed by at least one of the semiconductor portions electrically connecting the two electrodes of said transistor together, and in which,
- the largest dimensions $L_{SC}$ of the semiconductor portions may be approximately perpendicular to the largest dimension $W_{SD}$ of the electrodes, the electrodes possibly having similar shapes and dimensions $W_{SD}$, $L_{SD}$,
- a distance $E_{TR}$ separating the electrodes of two transistors along a direction parallel to the largest dimension of the semiconductor portions, that may be greater than about the largest dimension of the semiconductor portions, and
- the electrodes of two transistors may be offset along a direction approximately parallel to the largest dimension $W_{SD}$ of the electrodes, by a distance $E_{CO}$ greater than about the smallest dimension $W_{SC}$ of the semiconductor portions.

The transistor or each transistor may also comprise a gate dielectric and a gate, arranged facing the active zone of said transistor.

The semiconductor portions may comprise at least one organic semiconductor.

The invention also relates to a method of making a microelectronic device comprising at least the following steps:
- make a plurality of disconnected semiconductor portions with similar dimensions $L_{SC}$, $W_{SC}$ and shapes, electrically isolated from each other and forming a semiconductor layer, each semiconductor portion being spaced from adjacent semiconductor portions by an approximately constant distance $E_{SCH}$, $E_{SCV}$,
- make at least two electrodes in contact with the semiconductor layer such that the maximum distance $L_{channel}$ separating the two electrodes is less than about the largest dimension $L_{SC}$ of one of the semiconductor portions, the shape and dimensions $L_{SC}$, $W_{SC}$ of the semiconductor portions, the space $E_{SCH}$, $E_{SCV}$ between the semiconductor portions, the shape and dimensions $L_{SD}$, $W_{SD}$ of the electrodes and the arrangement of the electrodes relative to the semiconductor portions being such that at least one of the semiconductor portions electrically connects the two electrodes to each other.

The semiconductor portions may be made using a semiconductor deposition step of screen printing, stamping or heliography type, or using a step to deposit a layer of said semiconductor followed by an ablation step by laser or by photolithography or by stamping of the semiconductor layer.

The semiconductor portions may be made firstly on a substrate, the electrodes then being made on the semiconductor portions. In one variant, electrodes may be made firstly on a substrate, and the semiconductor portions can then be made on the electrodes.

BRIEF DESCRIPTION OF THE DRAWINGS

This invention will be better understood after reading the description of example embodiments given purely for guidance and that are in no way limitative with reference to the appended drawings in which.

Identical, similar or equivalent parts of the different figures described below have the same numeric references to facilitate comparisons between the different figures.

The different parts shown in the figures are not necessarily all shown at the same scale, to make the figures more easily readable.

The different possibilities (variants and embodiments) must be understood as being not mutually exclusive and they may be combined together.

DETAILED PRESENTATION OF PARTICULAR EMBODIMENTS

Figure 1:
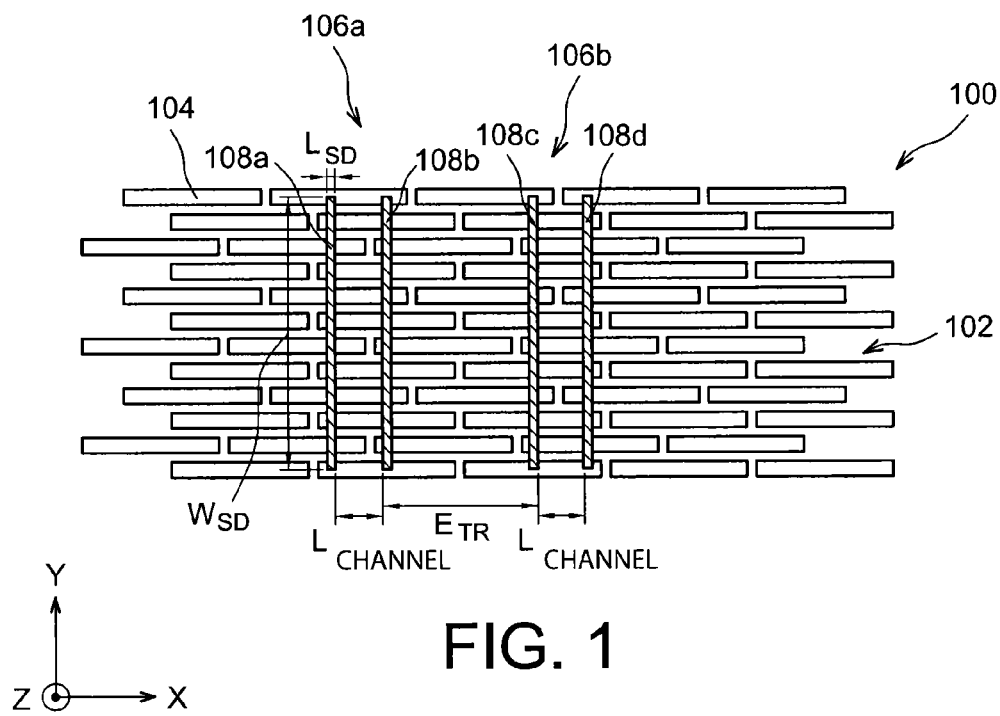
FIGS. 1 to 3 are diagrammatic top views of part of elements of a microelectronic device according to a particular embodiment of this invention.

We will start by referring to FIG. 1 that diagrammatically and partially shows a microelectronic device 100 comprising a semiconductor layer 102 formed by a plurality of disconnected semiconductor portions 104.

These disconnected semiconductor portions 104 all have a rectangular shape on the example in FIG. 1 and the dimensions of the different portions are similar. Considering that the portions 104 are disconnected, in other words they are not in contact with each other, they are electrically isolated from each other.

FIG. 1 shows that the semiconductor portions 104 form a discrete regular pattern of rectangles in the (X,Y) plane, forming lines all parallel to each other of semiconductor portions 104. Furthermore, the spaces separating the semiconductor portions 104 have approximately constant dimensions between all semiconductor portions 104. As a variant, the semiconductor portions 104 may have a shape other than rectangular, while remaining uniformly distributed.

The semiconductor portions 104 in adjacent lines are not vertically aligned above each other (along the Y axis). The semiconductor portions 104 in adjacent lines are horizontally offset (along the x axis). Moreover, there is a regularity in this horizontal offset. The pattern formed by the portions 104 is composed of several similar groups of lines of semiconductor portions arranged above each other. Thus, on the example in FIG. 1, it can be seen that the pattern formed by the set of semiconductor portions 104 is composed of similar groups of four lines arranged above each other. In other words, the semiconductor portions 104 in one of the lines are aligned vertically (along the Y axis) with semiconductor portions 104 in the line four lines below it and in the line four lines above it.

Figure 2:
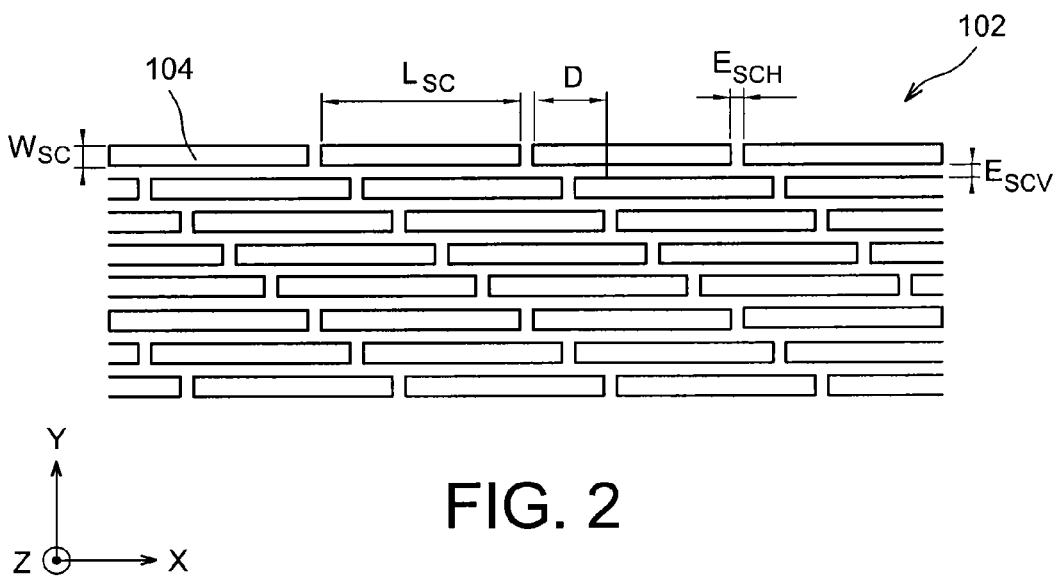

Another example pattern formed by the semiconductor portions 104 in the layer 102 is shown in FIG. 2. In this example, it can be seen that the semiconductor portions 104 are offset, from one line to the next, horizontally by a distance D. Moreover on this example, the semiconductor portions 104 of one line are aligned vertically (along the Y axis) with the semiconductor portions 104 in the lines five lines above and below this line.

Considering that this offset D is identical from one line to the next, the result is therefore:

$$L_{SC} + E_{SCH} = n*D$$

where $L_{SC}$ is the length (or more generally the largest dimension) of a semiconductor portion 104, $E_{SCH}$ is the horizontal space between two semiconductor portions 104, in other words the distance separating two adjacent semiconductor portions 104 in the same line, n is the number of semiconductor portions 104 that form the repetition step, greater than 1.

In the example in FIG. 2, n=5 because the initial alignment of a line of semiconductor portions 104 is located five lines away.

The space between two lines of semiconductor portions 104, denoted $E_{SCV}$ in the example in FIG. 2, may be approximately similar to the horizontal space between two semiconductor portions 104, such that $E_{SCV} = E_{SCH}$.

Although the semiconductor portions 104 in the examples in FIGS. 1 and 2 are each rectangular, these portions may have a different shape, but advantageously they will have an oblong or elongated shape.

Some of the disconnected semiconductor portions 104 will form the active zone(s) of the microelectronic device 100, and will be in contact with the electrodes of the microelectronic device 100.

In the example in FIG. 1, the microelectronic device 100 comprises two transistors 106a, 106b each comprising two electrodes, referenced 108a, 108b and 108c, 108d respectively. These electrodes 108a-108d correspond to the source and drain electrodes of the transistors 106a, 106b and are arranged in contact with the semiconductor layer 102 formed by the semiconductor portions 104. Each of these electrodes 108a-108d is approximately rectangular in shape with a length (the longest dimension) being approximately perpendicular to the length of the semiconductor portions 104.

Furthermore, the two electrodes 108a, 108b and 108c, 108d of each transistor 106a, 106b are at a spacing from each other equal to a distance $L_{channel}$, which corresponds to the length of the transistor channel, which is less than $L_{SC}$. Thus, the semiconductor portions 104 that are in contact with the two electrodes 108a, 108b, or 108c, 108d of one of the transistors 106a, 106b are therefore capable of forming an electrical conduction path between these two electrodes. Therefore these semiconductor portions 104 form the active zone (source+drain+channel) of the transistor. On the example in FIG. 1, it can be seen that each of the active zones of the transistors 106a and 106b is formed by nine semiconductor portions 104 that are in contact with the two electrodes 108a, 108b or 108c, 108d of said transistor.

Considering that the semiconductor portions 104 and the electrodes 108a-108d are sized such that $L_{channel} < L_{SC}$, and that the electrodes 108a-108d are positioned such that the length of each electrode 108a-108d is approximately perpendicular to the length of the semiconductor portions 104, it is therefore possible to make the electrodes 108a-108d anywhere on the layer 102 formed by the semiconductor portions 104 without making any prior alignment of the electrodes 108a-108d relative to the semiconductor layer 102 considering that, regardless of the location of the electrodes 108a-108d, one or several semiconductor portions 104 are necessarily in contact with the two electrodes 108a, 108b et 108c, 108d of each transistor 106a, 106b and form active zones of the transistors 106a, 106b.

The distance $E_{TR}$ between the electrodes 108a-108d closest to the transistors 106a, 106b (between electrodes 108b and 108c on the example in FIG. 1), corresponding to the horizontal spacing between the two transistors 106a, 106b, is chosen to be greater than the length $L_{SC}$ of the semiconductor portions 104, to prevent short circuit between the transistors 106a, 106b. Thus, by respecting the condition $E_{TR} > L_{SC}$, none of the semiconductor portions 104 can short circuit the closest electrodes of each transistor 106a, 106b, regardless of the location of the transistors 106a, 106b on the semiconductor layer 102.

The length of the electrodes 108a-108d, denoted $W_{SD}$, is preferably chosen such that $W_{SD} >> W_{SC}$ or such that $W_{SD} > n \cdot W_{SC}$, where $W_{SC}$ corresponding to the width of the semiconductor portions 104 or more generally to the smallest dimension of the portions 104 considering that the semiconductor portions 104 may have a shape other than a rectangular shape. Considering that the electrodes 108a-108d are made without alignment relative to the semiconductor layer 102, respecting the condition $W_{SD} >> W_{SC}$ or $W_{SD} > n \cdot W_{SC}$ can result in a low statistical dispersion of the number of the semiconductor portions 104 forming the active zones of the different transistors made from semiconductor portions 104, and therefore a small dispersion of the current $I_{ON}$ between these different transistors. Therefore, it can be seen that the dispersion will reduce as the number n of the pattern formed by the semiconductor portions 104 increases.

The density of transistors that can be obtained depends on the spacing between two transistors $E_{TR}$, and therefore on the value of $L_{SC}$ (because $E_{TR} > L_{SC}$).

Therefore, the parameter n is the parameter that controls the compromise between the dispersion of characteristics of elements of the microelectronic device 100 and the density of these elements.

Figure 3:
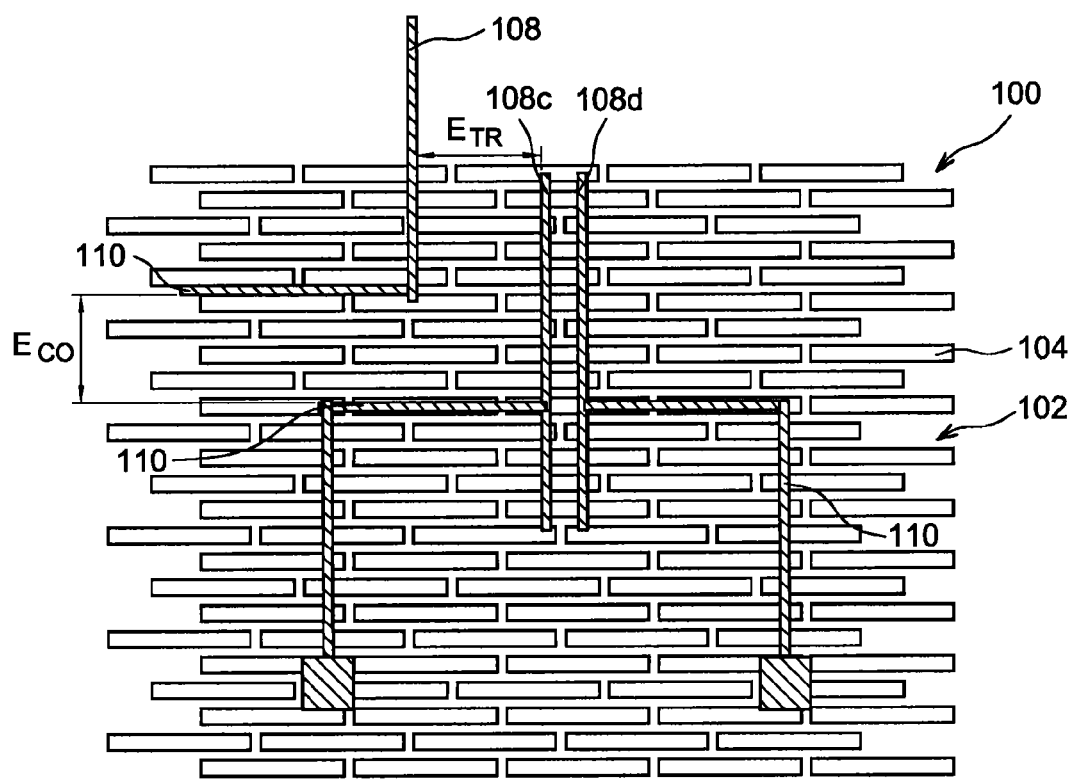
Figure 3:
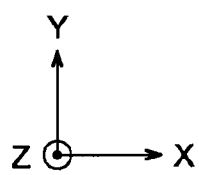

The transistors 106a, 106b also comprise connection lines, or electrical lines 110 electrically connected to the electrodes 108a-108d and formed on the semiconductor layer 102. Such electrical lines 110 are shown for example in FIG. 3. Considering that these electrical lines 110 can extend on the semiconductor layer 102 such that they are located above or below other contacts or electrical lines and/or other electrodes of adjacent transistors, these lines 110 are positioned such that a distance $E_{CO}$ corresponding to the space between two conducting elements of two distinct transistors, is greater than $W_{SC}$, in other words is greater than the width of the semiconductor portions 104. Thus, by respecting the condition $E_{CO} > W_{SC}$, it is guaranteed that a semiconductor portion 104 that is in contact with one of the two electrically conducting elements (electrical line or electrode) that are located one above the other will not be in contact with the other of the two elements.

Thus, it is possible to make the electrodes 108a-108d without any particular alignment related to the active zone(s) of the microelectronic device 100.

In the example described herein, the two transistors 106a, 106b are the same type, for example they are both n or p doped. However, it is also possible that the two transistors 106a, 106b may be different types of transistors, thus possibly forming a CMOS device. Such a device can be obtained either by depositing doped semiconductor zones with different types of doping (for example n and p), or by depositing different electrode materials within a single transistor or between the two transistors.

Figure 4:
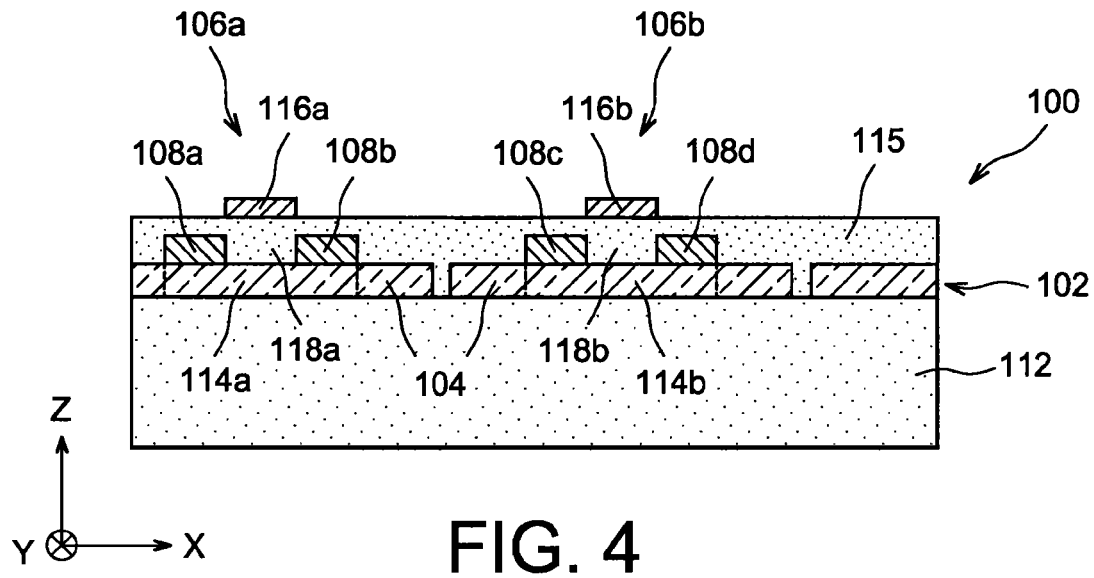
FIGS. 4 and 5 are diagrammatic sectional views of a microelectronic device according to two particular embodiments of this invention.

We will now refer to FIG. 4 that shows a sectional view of a first embodiment of the microelectronic device 100.

The microelectronic device 100 comprises a substrate 112, for example comprising glass or any other insulating material or any material covered by an insulating film, on which the semiconductor portions 104 are placed forming the semiconductor layer 102. The semiconductor portions 104 may comprise any semiconductor material, either organic or inorganic. When the semiconductor portions 104 comprise an organic material, this material may for example be pentacene or poly (triarylamine). When the semiconductor portions 104 comprise an inorganic material, this material may for example be zinc oxide (ZnO), amorphous silicon or polysilicon. The electrodes 108a-108d are made on the semiconductor portions 104 and comprise an electrically conducting material, for example a metal such as gold.

The zones 114a, 114b of the portions 104, delimited by the dashed lines in FIG. 4, form the active zones of transistors 106a, 106b.

The semiconductor portions 104 and the electrodes 108a-108d are covered by a dielectric layer 115, for example comprising $SiO_2$, $Si_3N_4$ or insulating polymers such as polystyrene or fluorided polymer such as CYTOP®, on which the gates 116a, 116b of the transistors 106a, 106b are made, for example comprising a metal such as gold, silver or a metallic ink or polysilicon. Portions 118a, 118b of the dielectric layer 115 between the gates 116a, 116b and the active zones 114a, 114b form gate dielectrics of the transistors 106a, 106b.

In one variant of this first example embodiment, the electrodes 108a-108d may be arranged directly against to or in contact with the substrate 112, and the semiconductor portions 104 can then be formed such that they cover the electrodes 108a-108d. In this case, the semiconductor portions 104 would be covered by the dielectric layer 115 on which the gates 116a, 116b would be located.

Figure 5:
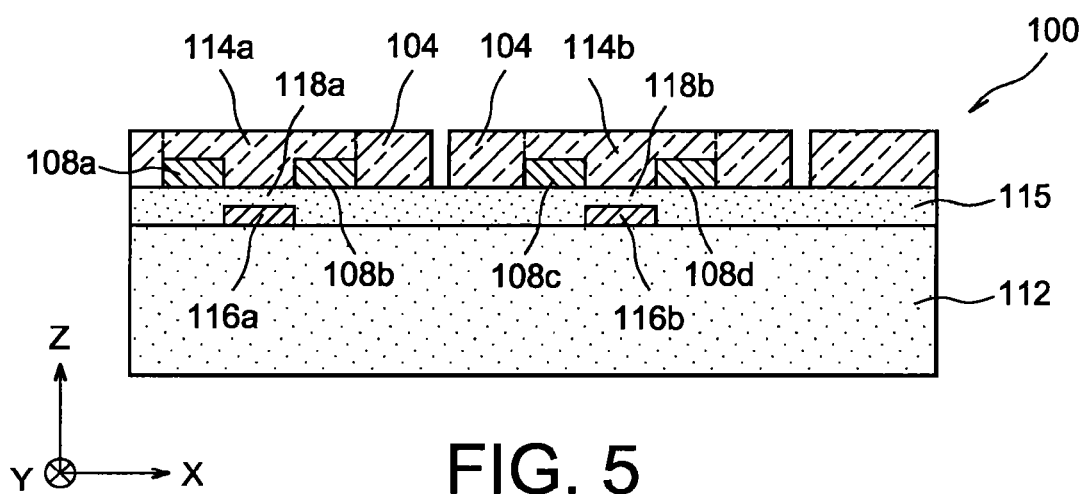

We will now refer to FIG. 5 that shows a sectional view of a second example embodiment of the microelectronic device 100.

Unlike the first example embodiment in FIG. 4, the gates 116a, 116b are firstly placed in contact with the substrate 112. These gates 116a, 116b are covered by the dielectric layer 115. The electrodes 108a-108d are then made on the dielectric layer 115.

Finally, the semiconductor portions 104 are made on the dielectric layer 115 and on the electrodes 108a-108d.

In one variant of this second example embodiment, it is possible that the semiconductor portions 104 are placed in contact with the dielectric layer 115 and that the electrodes 108a-108d are then made on the semiconductor portions 104.

In the examples described above, the microelectronic device 100 comprises several transistors. However, it is quite possible that the semiconductor device 100 comprises other electronic components instead of transistors, each comprising at least two electrodes, for example diodes.

Different production techniques may be used to make the semiconductor layer 102 comprising disconnected semiconductor portions 104. The choice of the technique to be used will be made particularly as a function of the dimensions of the semiconductor portions 104.

Thus, for semiconductor portions 104 with width $W_{SC}$ of the order of 1 µm or more generally less than about 10 µm, these portions 104 may be advantageously made by Nanoimprint lithography or by stamping, or deposition of a complete semiconductor layer followed by laser ablation or photolithography of this layer. For semiconductor portions 104 with width $W_{SC}$ greater than or equal to about 10 µm, these portions 104 may advantageously be made by heliography or by the previously mentioned techniques.

The number n could be chosen to be relatively large, for example of the order of 10, or between 10 and 20 to obtain a small dispersion (about 10%) on the electrical characteristics of the elements of the semiconductor device 100. Thus with a number n equal to 10 and a width $W_{SC}$ equal to about 1 µm, the length of the electrodes $W_{SD}$ will be chosen to be greater than about 10 µm.

For example, the channel length $L_{channel}$ is equal to about 5 µm. In this case, the length $L_{SC}$ of portions 104 is for example equal to about $n*L_{channel}$, in other words equal to about 50 µm. Therefore the space between the transistors $E_{TR}$ will be chosen to be greater than 50 µm, for example equal to about 60 µm.

The dimensions $E_{SCH}$ and $E_{SCV}$ between the semiconductor portions may be chosen to be as small as possible, provided that the electrical insulation between the semiconductor portions 104 is well maintained. These dimensions may be of the order of a micrometer when the portions 104 are made by heliography, or of the order of about 100 nm when the portions 104 are made by stamping, or of the order of a few tens of nanometers when the portions 104 are made by photolithography or by laser ablation. In general, the minimum dimensions that can be achieved will depend on the technique(s) used to make the semiconductor layer 102.

The dimensions given above clearly illustrate the fact that the integration density of electronic elements made from the semiconductor layer 102 can be increased, because the manufacture of the semiconductor device 100 does not require an alignment step. Thus, as mentioned above, the channel length of one of the transistors may be equal to about 5 µm, which is much less than the channel length of transistors made according to general practice and for which alignment steps are necessary. The length of the electrodes $W_{SD}$, for example equal to about 10 µm in the example given above, is also much less than the length of the electrodes of transistors for which an alignment step is required, and which is usually equal to about 1 mm.

The invention claimed is:

1. A microelectronic device, comprising:
   a plurality of disconnected semiconducting portions with approximately similar dimensions $L_{SC}$, $W_{SC}$ and similar shapes, electrically isolated from each other and forming a semiconductor layer, each of the semiconductor portions being at a spacing from adjacent semiconductor portions by an approximately constant distance $E_{SCH}$, $E_{SCV}$ and having an elongated shape of which the largest dimension $L_{SC}$ is approximately parallel to the largest dimensions $L_{SC}$ of the other semiconductor portions; and
   at least two electrodes arranged in contact with the semiconductor layer such that a maximum distance $L_{channel}$ separating the two electrodes is less than the largest dimension $L_{SC}$ of one of the semiconductor portions, wherein
   the shape and dimensions $L_{SC}$, $W_{SC}$ of the semiconductor portions, the spacing $E_{SCH}$, $E_{SCV}$ between the semiconductor portions, the shape and dimensions $L_{SD}$, $W_{SD}$ of the electrodes and the layout of the electrodes relative to the semiconductor portions are such that at least one of the semiconductor portions electrically connects the two electrodes to each other,
   the largest dimensions $L_{SC}$ of the semiconductor portions are approximately perpendicular to the largest dimension $W_{SD}$ of the electrodes, the electrodes having similar shapes and dimensions $W_{SD}$, $L_{SD}$,
   the semiconductor portions are arranged in a plane parallel to a principal face of the semiconductor layer in contact with which the electrodes are arranged, following a regular pattern of parallel lines,
   spaces $E_{SCH}$ between the semiconductor portions on a single line are offset relative to the spaces between the semiconductor portions of an adjacent line and along a direction parallel to the lines, by a distance D equal to about the largest dimension $L_{SC}$ of the semiconductor portions divided by n, where n is a real number between 10 and 20, and the largest dimension $L_{SC}$ of the semiconductor portions is approximately equal to n times the maximum distance $L_{channel}$ separating the two electrodes and/or the largest dimension $W_{SD}$ of the electrodes is greater than about n times the smallest dimension $W_{SC}$ of the semiconductor portions.

2. The device according to claim 1, wherein each of the semiconductor portions has an approximately rectangular shape.

3. The device according to claim 1, further comprising at least one transistor of which an active zone is formed by said at least one of the semiconductor portions electrically connecting the two electrodes to each other, said electrodes forming source and drain electrodes of the transistor.

4. The device according to claim 3, wherein the at least one transistor comprises a gate dielectric and a gate arranged facing the active zone of said transistor.

5. The device according to claim 1, further comprising a plurality of transistors, each transistor comprising:

at least two electrodes forming source and drain electrodes arranged in contact with the semiconductor layer such that the maximum distance $L_{channel}$ separating the two electrodes of one of the transistors is less than about the largest dimension $L_{SC}$ of one of the semiconductor portions; and an active zone formed by at least one of the semiconductor portions electrically connecting the two electrodes of said transistor together, wherein the largest dimensions $L_{SC}$ of the semiconductor portions are approximately perpendicular to the largest dimension $W_{SD}$ of the electrodes, the electrodes possibly having similar shapes and dimensions $W_{SD}$, $L_{SD}$, a distance $E_{TR}$ separating the electrodes of two transistors, along a direction parallel to the largest dimension $L_{SC}$ of the semiconductor portions, that may be greater than about the largest dimension $L_{SC}$ of the semiconductor portions, and the electrodes of two transistors being offset, along a direction approximately parallel to the largest dimension $W_{SD}$ of the electrodes, by a distance $E_{CO}$ greater than about the smallest dimension $W_{SC}$ of the semiconductor portions.

6. The device according to claim 5, wherein each transistor comprises a gate dielectric and a gate arranged facing the active zone of said transistor.

7. A method of making a microelectronic device, comprising:

providing a plurality of disconnected semiconductor portions with approximately similar dimensions $L_{SC}$, $W_{SC}$ and shapes, electrically isolated from each other and forming a semiconductor layer, each semiconductor portion being spaced from adjacent semiconductor portions by an approximately constant distance $E_{SCH}$, $E_{SCV}$ and having an elongated shape of which the largest dimension $L_{SC}$ is approximately parallel to the largest dimensions $L_{SC}$ of the other semiconductor portions; and arranging at least two electrodes in contact with the semiconductor layer such that a maximum distance $L_{channel}$ separating the two electrodes is less than approximately the largest dimension $L_{SC}$ of one of the semiconductor portions, wherein the shape and dimensions $L_{SC}$, $W_{SC}$ of the semiconductor portions, the spacing $E_{SCH}$, $E_{SCV}$ between the semiconductor portions, the shape and dimensions $L_{SD}$, $W_{SD}$ of the electrodes and the layout of the electrodes relative to the semiconductor portions being such that at least one of the semiconductor portions electrically connects the two electrodes to each other, the largest dimensions $L_{SC}$ of the semiconductor portions are approximately perpendicular to the largest dimension $W_{SD}$ of the electrodes, the electrodes having similar shapes and dimensions $W_{SD}$, $L_{SD}$, the semiconductor portions are arranged in a plane parallel to a principal face of the semiconductor layer in contact with which the electrodes are arranged, following a regular pattern of parallel lines, spaces $E_{SCH}$ between the semiconductor portions on a single line are offset relative to the spaces between the semiconductor portions of an adjacent line and along a direction parallel to the lines, by a distance D equal to about the largest dimension $L_{SC}$ of the semiconductor portions divided by n, where n is a real number between 10 and 20, and the largest dimension $L_{SC}$ of the semiconductor portions is approximately equal to n times the maximum distance $L_{channel}$ separating the two electrodes and/or in which the largest dimension $W_{SD}$ of the electrodes is greater than about n times the smallest dimension $W_{SC}$ of the semiconductor portions.

8. The method according to claim 7, wherein semiconductor portions are made firstly on a substrate, the electrodes then being made on the semiconductor portions, or in which the electrodes are made firstly on a substrate, and the semiconductor portions are then made on the electrodes.

9. The method according to claim 7, wherein the semiconductor portions are made using a semiconductor deposition step of screen printing, stamping or heliography type, or using a step to deposit a layer of said semiconductor followed by an ablation step by laser or by photolithography or by stamping of the semiconductor layer.

10. The method according to claim 9, wherein semiconductor portions are made firstly on a substrate, the electrodes then being made on the semiconductor portions, or in which the electrodes are made firstly on a substrate, and the semiconductor portions are then made on the electrodes.

* * * * *